United States Patent
Akhtar

(10) Patent No.: US 8,994,435 B2
(45) Date of Patent: Mar. 31, 2015

(54) SWITCHING CORE LAYOUT

(75) Inventor: Siraj Akhtar, Richardson, TX (US)

(73) Assignee: Texas Instruments Incorporation, Dallas, TX (US)

( * ) Notice: Subject to any disclaimer, the term of this patent is extended or adjusted under 35 U.S.C. 154(b) by 365 days.

(21) Appl. No.: 13/490,264

(22) Filed: Jun. 6, 2012

(65) Prior Publication Data

US 2012/0242403 A1  Sep. 27, 2012

Related U.S. Application Data

(63) Continuation of application No. 12/899,390, filed on Oct. 6, 2010, now Pat. No. 8,212,611.

(51) Int. Cl.
*H01L 25/00* (2006.01)
*H03D 7/14* (2006.01)
*H03D 7/16* (2006.01)

(52) U.S. Cl.
CPC .......... *H03D 7/1458* (2013.01); *H03D 7/1441* (2013.01); *H03D 7/165* (2013.01); *H03D 7/1433* (2013.01); *H03D 7/1483* (2013.01); *H03D 2200/0019* (2013.01); *H03D 2200/0082* (2013.01)

USPC .......... 327/356; 327/357; 327/358; 327/359; 327/360; 327/361

(58) Field of Classification Search
USPC ................. 327/564–566, 356–361
See application file for complete search history.

(56) References Cited

U.S. PATENT DOCUMENTS 7,774,019 B2  8/2010  Sivonen et al.
7,777,579 B2  8/2010  Li

*Primary Examiner* — Tran Tran
(74) *Attorney, Agent, or Firm* — Alan A. R. Cooper; Frank D. Cimino

(57) ABSTRACT

Traditionally, mixers have been arranged symmetrically around the input signal, which has resulted in problems due to self-mixing or feed-through by the local oscillator signal. Here, however, the arrangement for a mixer has been changed to generally avoid self-mixing of the local oscillator signal. In particular, transistors in the switching core are merged according to the portion of the local oscillator signal received. This, in turn, results in the conductors, which carry the different portions of the local oscillator signal, being separated (or not having any crossings) so as to generally eliminate self-mixing or feed-through of the local oscillator signal. Complex IQ mixers realized using this arrangement benefit from improved sideband suppression and image rejection.

14 Claims, 11 Drawing Sheets

SWITCHING CORE LAYOUT

CROSS-REFERENCE TO RELATED APPLICATIONS

This application is a continuation of U.S. patent application Ser. No. 12/899,390, filed on Oct. 6, 2010, which is hereby incorporated by reference for all purposes.

TECHNICAL FIELD

The invention relates generally to a Gilbert cell mixer and, more particularly, to a layout for the switching core of a Gilbert cell mixer.

BACKGROUND

Gilbert mixing cells (such as cell or mixer 100 of FIG. 1) are commonly used in many radio frequency (RF) applications and circuits to perform upconversion and downconversion. A Gilbert mixing cell or mixer 100 comprises a switching core or switching quad 102 and a transconductance circuit 104. The switching core 102 is generally comprised of transistors Q1 to Q4 (which can be NMOS transistors), and the transconductance circuit 104 is generally comprised of a differential input pair of transistors Q5 and Q6 (which can also be NMOS transistors).

Looking to upconversion, as an example and as shown, in operation the mixer 100 a differential input signal IFP and IFM is converted to a differential radio frequency (RF) signal RFP and RFM. To accomplish this, input signal IFP and IFM are provided to the gates of transistors Q5 and Q6, and a corresponding signal from this transconductance circuit 104 is provided to the sources of transistors Q1 through Q4. Differential local oscillator signal LOP and LOM are provided to the gates of transistors Q1 through Q4 in the switching core 102 so as to generate the differential RF signals RFP and RFM from the drains of transistors Q1 through Q4.

Typically, the layout for switching core 102 is similar to the diagram of FIG. 1, namely, that transistors Q1 and Q2 are adjacent to one another and transistors Q3 and Q4 are adjacent to one another. Turning to FIGS. 2 through 4, an example of such a layout can be seen. As shown, transistors Q1 through Q4 are generally formed of a number of polysilicon gate electrode "fingers" 203 that separate source regions 205 and drain regions 204 (which are arranged in alternating patters). Gate dielectrics 208 (which can be, for example, silicon dioxide) are generally formed between the substrate 201 and the gate electrodes 203 with sidewalls 210 (which can also be formed of silicon dioxide) formed on either side of the gate electrodes 203. Vias 206 (which can be filled with tungsten) can electrically couple the source and drain regions 204 and 205 to other layers, while vias 212 can electrically couple gate electrodes 203 to other layers. These transistor pairs Q1/Q2 and Q3/Q4 are, as shown, also have a dummy region 202 formed therebetween. There may also be other dummy regions (not shown) and other dummy features, such as "ghost polysilicon fingers," (not shown) that may be used for balancing.

Turning to FIG. 5 through 7, the couplings for the transistors Q1 through Q4 can be seen. As shown in FIG. 1, differential local oscillator signal LOP and LOM are provided to the gates of transistors Q1 through Q4. To accomplish this, different portions 508 and 510 of metallization layer 502 are coupled to the gates of transistors Q1 through Q4. As shown, portion 508 is coupled to the gates of transistors Q1 and Q4, while portion 510 is coupled to the gates of transistors Q2 and Q3. However, in order to make these couplings, a jumper (which is provided to enable portions 508 and 510 to cross) is included in portion 508. As shown, this jumper includes vias 506, which couples the metallization layer 502 to metallization layer 504. Another alternative for a jumper would be generally parallel lines formed in metallization layer 504 for each of portions 508 and 510. Additionally, as can be seen in FIG. 6, metallization layer 504 can also couple the sources of transistor pairs Q1/Q2 and Q3/Q4 together with portions 602 and 604. In FIG. 7, the couplings for the drains of transistors Q1 through Q4 can be seen. Here portions 706 and 708 couple the drains of transistor Q1 through Q4 together. As shown, portion 708 also includes a jumper which uses vias 704 and metallization layer 704.

A problem with this arrangement is portions 508 and 510 (of FIG. 5) are not separate from one another but, instead, cross. This crossing can create an interference (generally known as local oscillator phase and amplitude imbalance) for both upconversion mixers or downconversion mixers because the portions of the differential local oscillator signal LOP and LOM interfere with one another, and as frequencies increase, this interference is even more apparent. Namely, the crossing breaks the differentially of the differential local oscillator signal LOP and LOM causing feed-through (for transmitters) or self-mixing (for receivers) to arise. Further in complex mixing, where two such mixers are used in an I (in phase) and Q (quadrature) fashion, the problem of local oscillator phase and amplitude imbalance leads to reduction in image suppression (for transmitters) and image rejection (for receivers). Therefore, there is a need for a mixer with an improved layout that generally compensates for local oscillator phase and amplitude imbalance.

SUMMARY

A preferred embodiment of the present invention, accordingly, provides an apparatus. The apparatus comprising: a first transistor having a control electrode formed over a substrate, a first conduction region formed in the substrate, and a second conduction region formed in the substrate; a second transistor having a control electrode formed over the substrate, a first conduction region formed in the substrate, and a second conduction region formed in the substrate; a third transistor having a control electrode formed over the substrate, a first conduction region formed in the substrate, and a second conduction region formed in the substrate; a fourth transistor having a control electrode formed over the substrate, a first conduction region formed in the substrate, and a second conduction region formed in the substrate; a first portion of a first metallization layer formed over the substrate that carries a first portion of a differential local oscillator signal, wherein the first portion of the first metallization layer is coupled to the gates electrodes of the first and second transistors; a second portion of a first metallization layer formed over the substrate that carries a second portion of the differential local oscillator signal, wherein the first portion of the first metallization layer is coupled to the gates electrodes of the third and fourth transistors, wherein the first and second portions are separated from one another; a first portion of a second metallization that is formed over the substrate, wherein the first portion of the second metallization layer is coupled to the first conduction regions of the first and fourth transistors; and a second portion of the second metallization layer that is formed over the substrate, wherein the second portion of the second metallization layer is coupled to the first conduction regions of the second and third transistors, and wherein one of the first and second portions of the second metallization layer includes a jumper so as to enable the first and second portions of the second metallization layer to cross.

In accordance with a preferred embodiment of the present invention, each control electrode further comprises a gate electrode, and wherein each first conduction region further comprises a source region, and wherein each second conduction region further comprises a drain region, and wherein the jumper further comprises a first jumper, and wherein the apparatus further comprises: a first portion of a third metallization layer formed over the substrate, wherein the first portion of the third metallization layer is coupled to the second conduction regions of first and third transistors; and a second portion of the third metallization layer formed over the substrate, wherein the second portion of the third metallization layer is coupled to the second conduction regions of the second and fourth transistors, and wherein at least one of the first and second portions of the third metallization layer includes a second jumper so as to enable the first and second portions of the third metallization layer to cross.

In accordance with a preferred embodiment of the present invention, the first jumper further comprises first and second portions of a fourth metallization layer, wherein the first portion of the second metallization layer is coupled to the first portion of the fourth metallization layer, and wherein the second portion of the second metallization layer is coupled to the second portion of the fourth metallization layer.

In accordance with a preferred embodiment of the present invention, the first and second portions of the fourth metallization layer further comprise first and second lines that are generally parallel to one another.

In accordance with a preferred embodiment of the present invention, the first jumper further comprises a portion of a fourth metallization layer that is formed over a section of the second portion of the second metallization that is coupled to the first portion of the second metallization layer.

In accordance with a preferred embodiment of the present invention, the second jumper further comprises first and second portions of a fourth metallization layer, wherein the first portion of the third metallization layer is coupled to the first portion of the fourth metallization layer, and wherein the second portion of the third metallization layer is coupled to the second portion of the fourth metallization layer.

In accordance with a preferred embodiment of the present invention, the first and second portions of the fourth metallization layer further comprise first and second lines that are generally parallel to one another.

In accordance with a preferred embodiment of the present invention, the second jumper further comprises a portion of a fourth metallization layer that is formed over a section of the second portion of the second metallization that is coupled to the first portion of the second metallization layer.

In accordance with a preferred embodiment of the present invention, each of the first, second, third, and fourth transistors further comprises a plurality gate electrodes, a plurality of source regions, and a plurality of drain regions.

In accordance with a preferred embodiment of the present invention, an apparatus is provided. The apparatus comprises a transconductance circuit; and a switching core including: a first transistor having a gate electrode formed over a substrate, a source region formed in the substrate, and a drain region formed in the substrate; a second transistor having a gate electrode formed over the substrate, a source region formed in the substrate, and a drain region formed in the substrate; a third transistor having a gate electrode formed over the substrate, a source region formed in the substrate, and a drain region formed in the substrate; a fourth transistor having a gate electrode formed over the substrate, a source region formed in the substrate, and a drain region formed in the substrate; a first portion of a first metallization layer formed over the substrate that carries a first portion of a differential local oscillator signal, wherein the first portion of the first metallization layer is coupled to the gates electrodes of the first and second transistors; a second portion of a first metallization layer formed over the substrate that carries a second portion of the differential local oscillator signal, wherein the first portion of the first metallization layer is coupled to the gates electrodes of the third and fourth transistors, wherein the first and second portions are separated from one another; a first portion of a second metallization that is formed over the substrate, wherein the first portion of the second metallization layer is coupled to the source regions of the first and fourth transistors, and wherein the first portion of the second metallization layer is coupled to the transconductance circuit; and a second portion of the second metallization layer that is formed over the substrate, wherein the second portion of the second metallization layer is coupled to the source regions of the second and third transistors, and wherein one of the first and second portions of the second metallization layer includes a jumper so as to enable the first and second portions of the second metallization layer to cross, and wherein the second portion of the second metallization layer is coupled to the transconductance circuit.

In accordance with a preferred embodiment of the present invention, the jumper further comprises a first jumper, and wherein the apparatus further comprises: a first portion of a third metallization layer formed over the substrate, wherein the first portion of the third metallization layer is coupled to the drain regions of first and third transistors; and a second portion of the third metallization layer formed over the substrate, wherein the second portion of the third metallization layer is coupled to the drain regions of the second and fourth transistors, and wherein at least one of the first and second portions of the third metallization layer includes a second jumper so as to enable the first and second portions of the third metallization layer to cross.

In accordance with a preferred embodiment of the present invention, the first, second, third, and fourth transistors further comprise first, second, third, and fourth NMOS transistors.

In accordance with a preferred embodiment of the present invention, the transconductance circuit further comprises: a fifth NMOS transistor that is coupled to the first portion of the second metallization layer its drain; and a sixth NMOS transistor that is coupled to the second portion of the second metallization layer at its drain and that is coupled o the source of the fifth NMOS transistor at its source.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
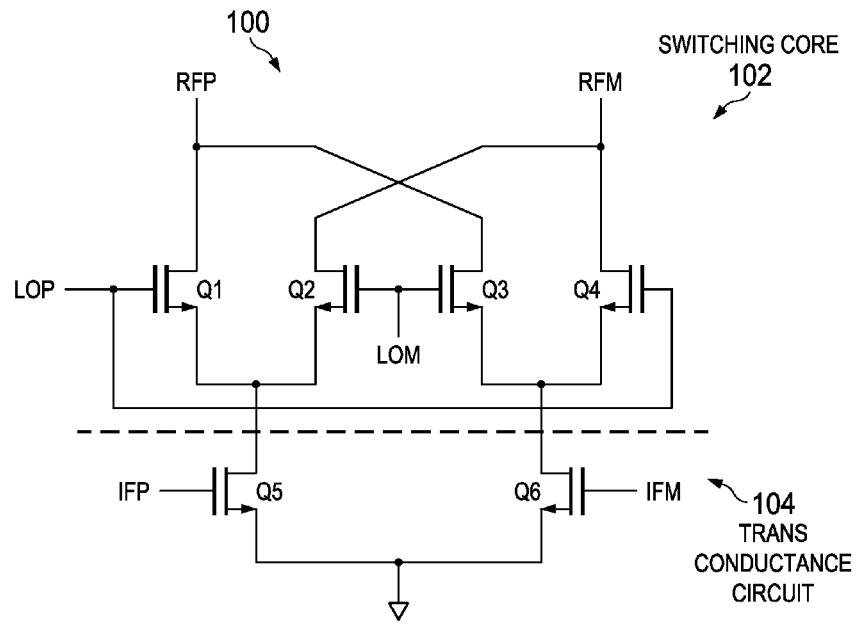
FIG. 1 is a circuit diagram of an example of a conventional mixer.

Refer now to the drawings wherein depicted elements are, for the sake of clarity, not necessarily shown to scale and wherein like or similar elements are designated by the same reference numeral through the several views.

Figure 8A:
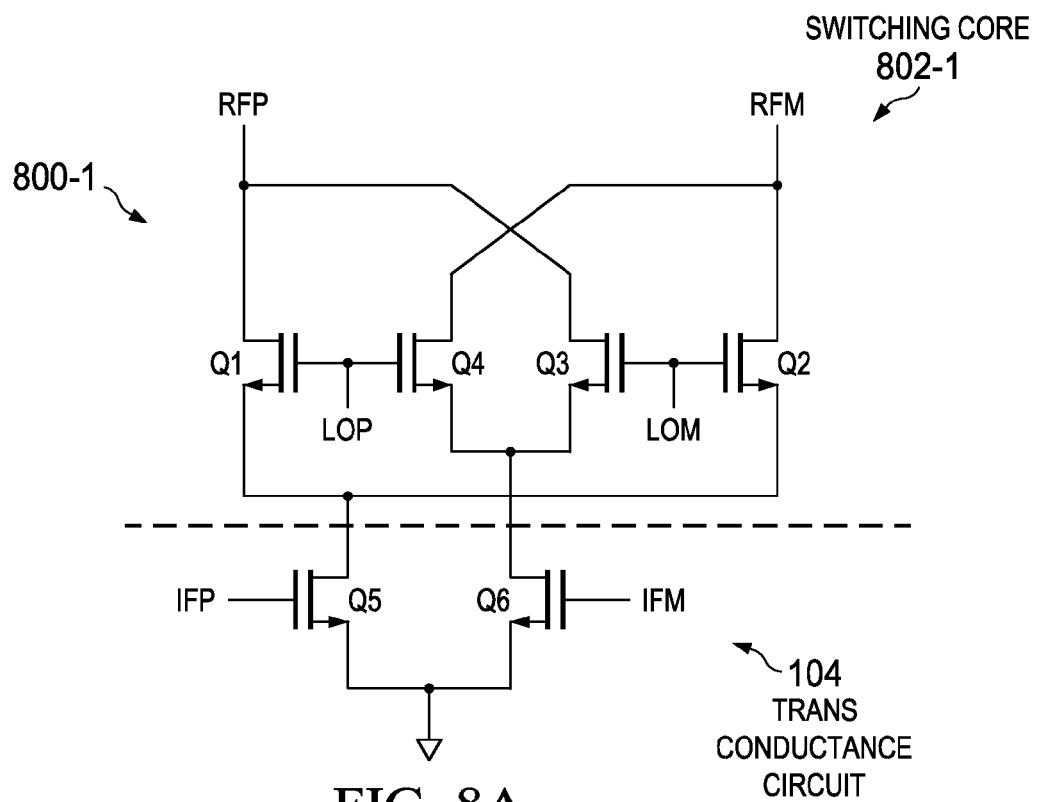
FIGS. 8A and 8B are a circuit diagrams of examples of a mixer in accordance with a preferred embodiment of the present invention.
Figure 8B:
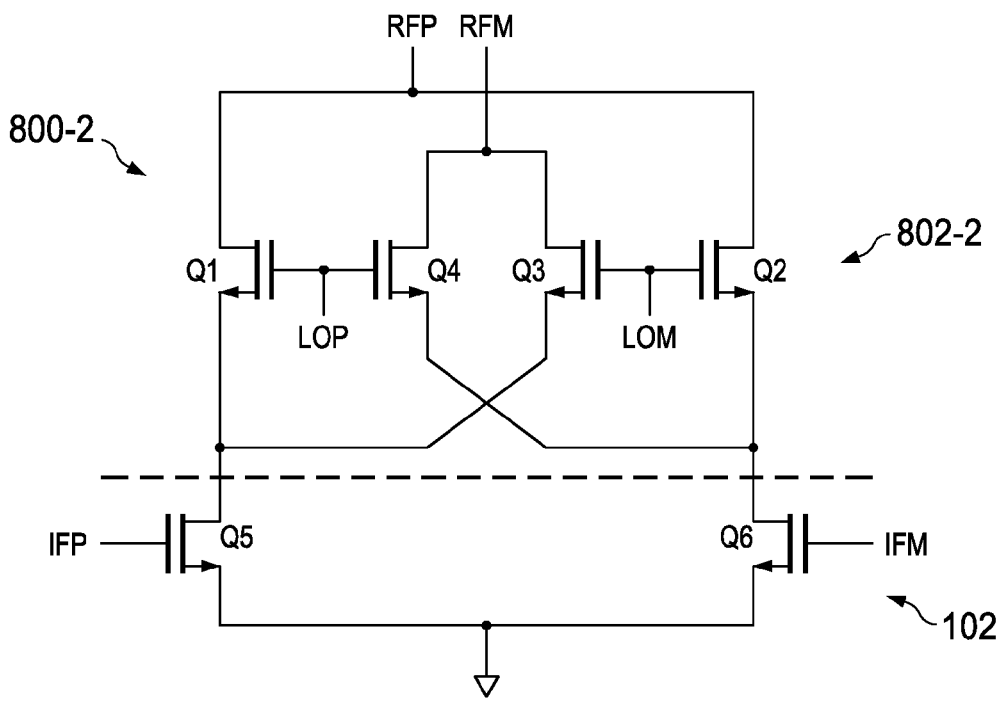
Figure 9:
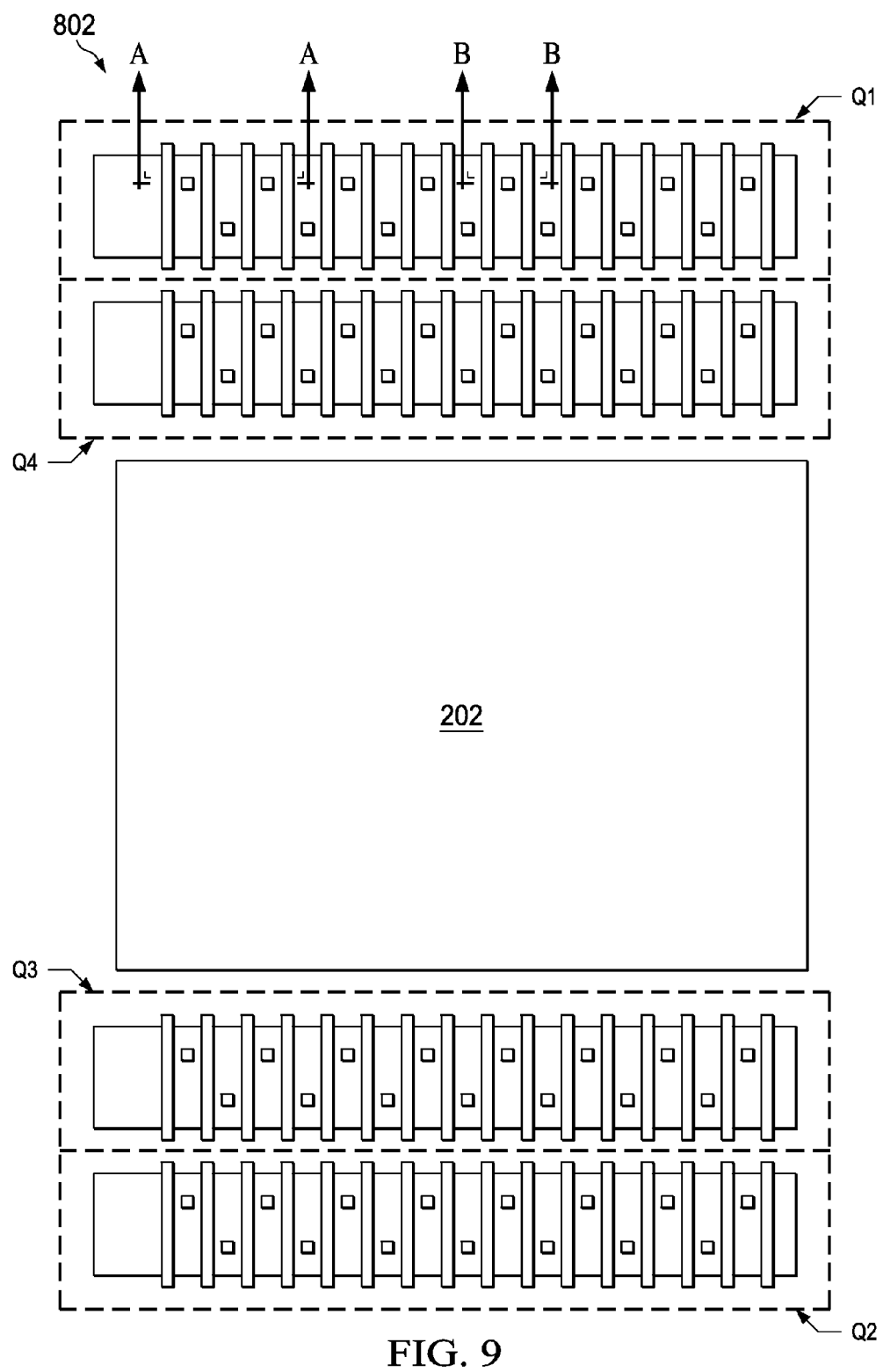
FIGS. 9 through 12 are plan views of the layout for the mixer of FIG. 8.

Turning to FIGS. 8A, 8B, and 9, examples of a mixer 800-1 and 800-2 in accordance with a preferred embodiment of the present invention can be seen. Similar to mixer 100, mixers 800-1 and 800-2 includes a transconductance circuit 102 and switching core 802-1 or 802-2. However, the arrangement of transistors Q1 through Q4 in switching core 802-1 and 802-2 is different from the arrangement in switching core 102. Namely, transistors Q1 and Q4 and transistors Q2 and Q3 are grouped together according to common reception of portions of the differential local oscillator signal LOP and LOM. Transistors Q1 through Q4 may also be bipolar (i.e., NPN) transistors or may be any other type of transistor (i.e., PMOS or NMOS).

Figure 10:
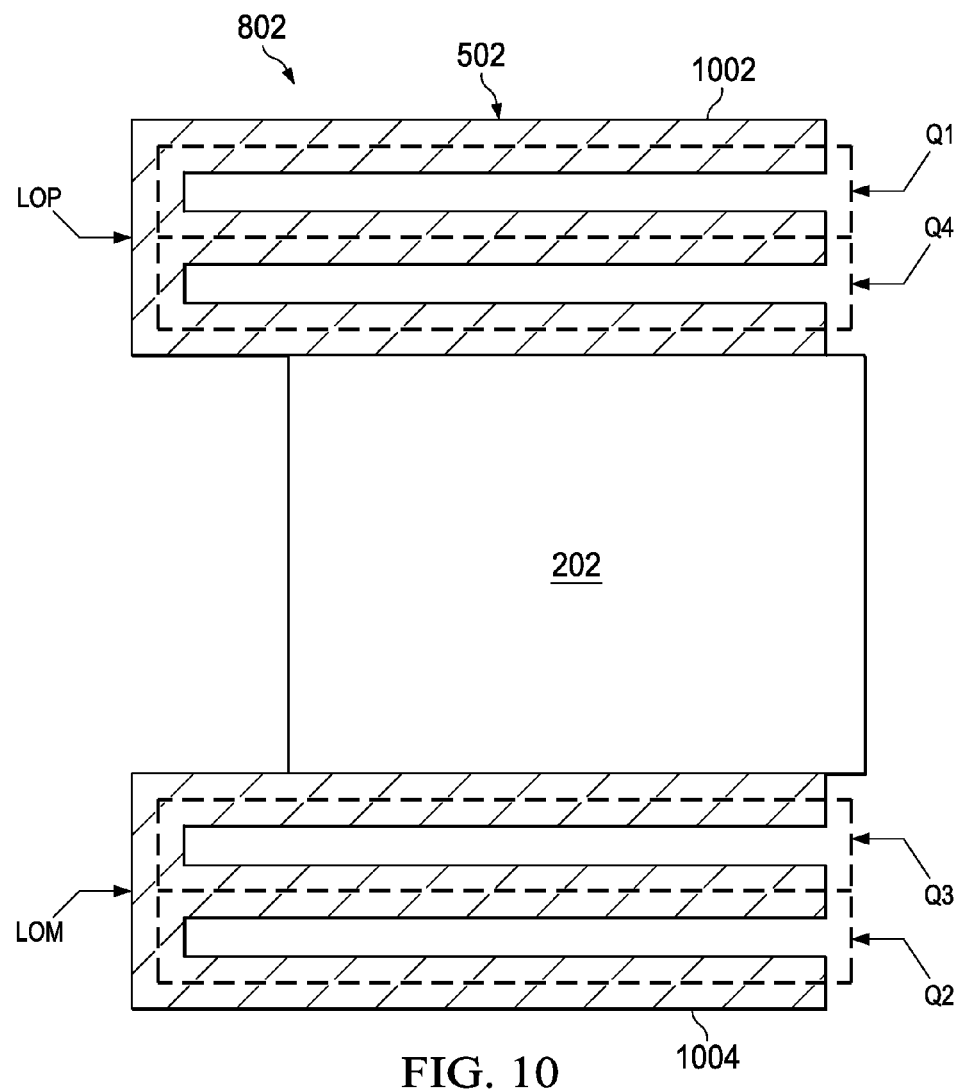

In FIG. 10, a reason for this arrangement should be apparent. Portions 1002 and 1004 of metallization layer 504 are separate from one another. In other words, portions 1002 and 1004 do not cross, so that portions of differential local oscillator signal LOP and LOM can be fed to transistors Q1 through Q4 without interfering with one another. This change in layout from mixer 100 to mixer 800-1 or 800-2 substantially improves performance by substantially reducing self-mixing or feed-through by generally compensating for local oscillator phase and amplitude imbalance through symmetry. It allows transistors Q1 and Q4 (and likewise Q3 and Q2) in switching core 802-1 to in effect be merged in the layout. This improves proximity amongst all devices in the switching cores, which improves random transistor mismatch due to semiconductor processing.

Figure 11:
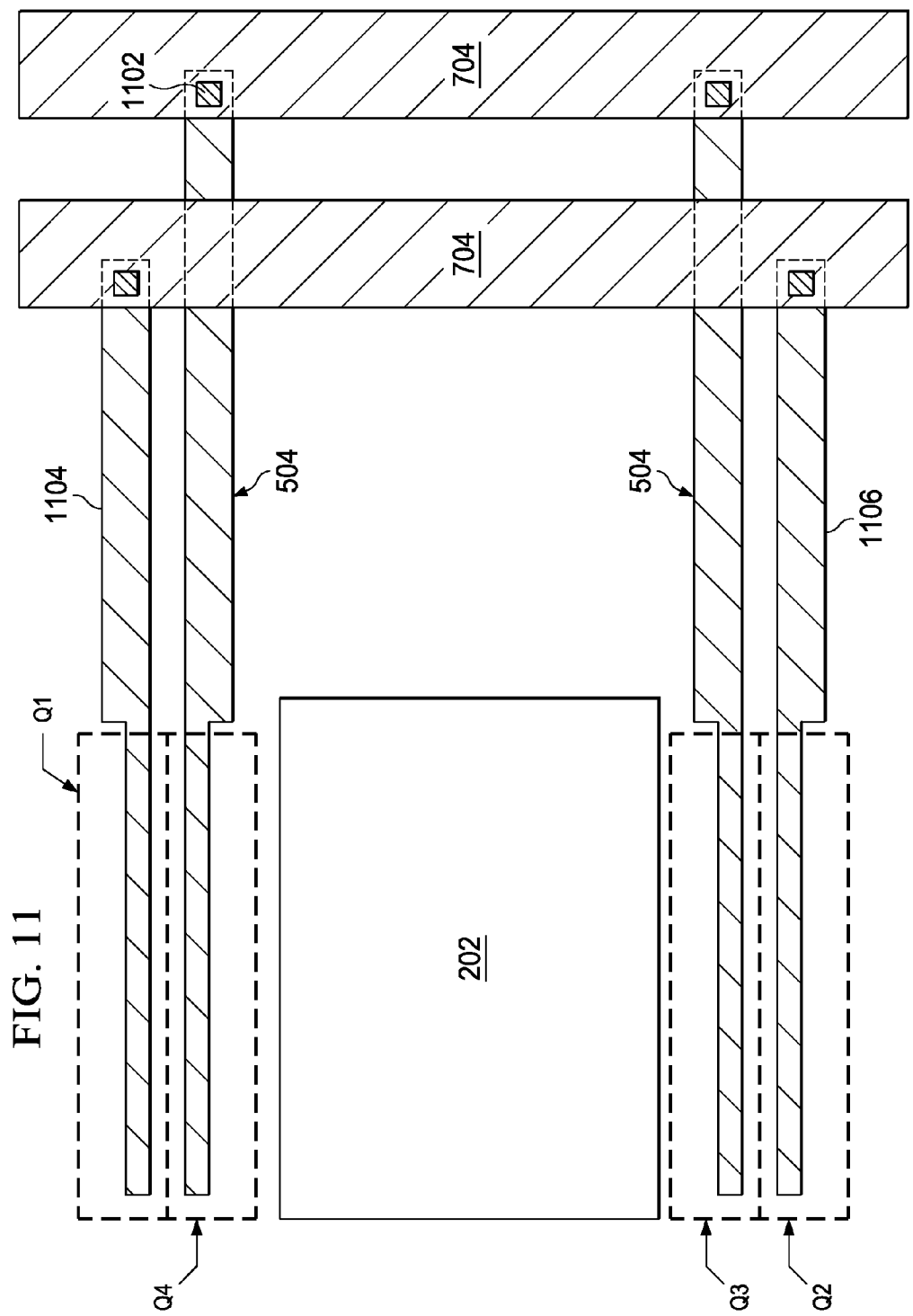
Figure 12:
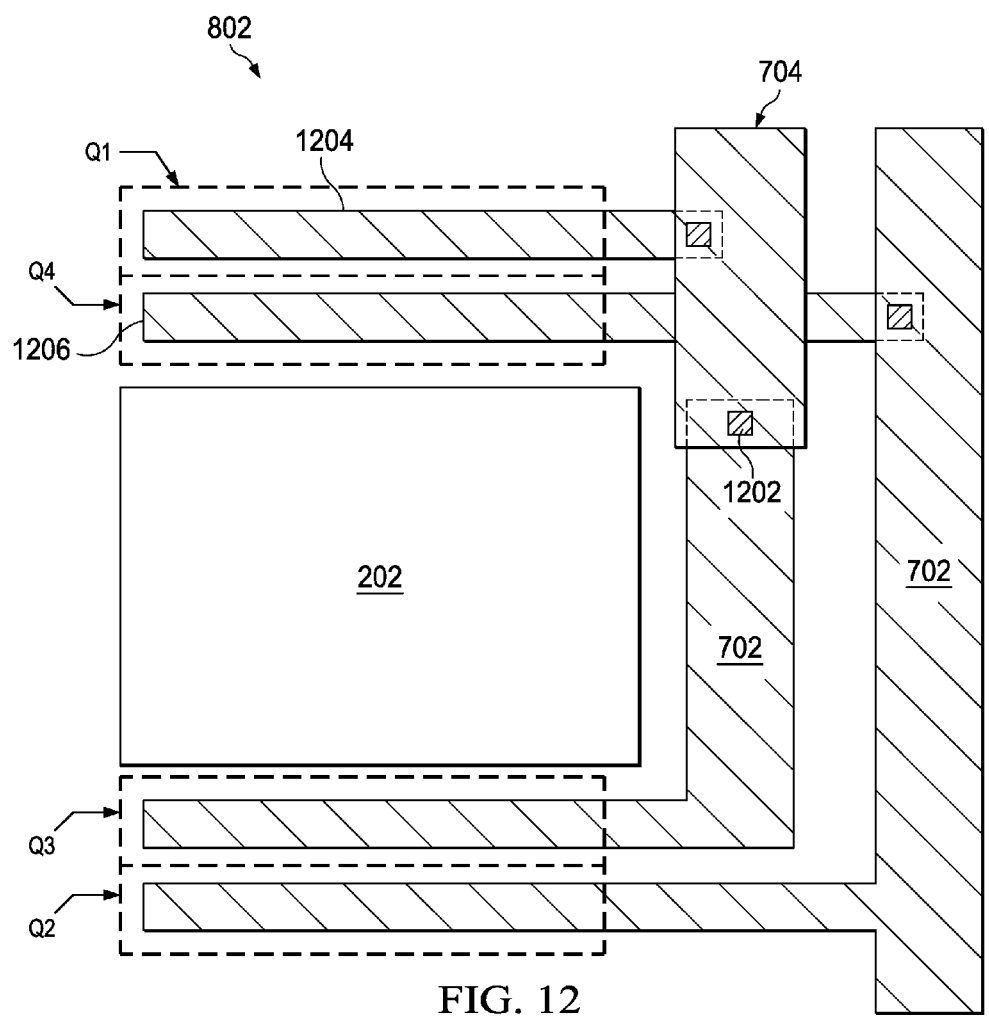

Now turning to FIGS. 11 and 12, the remainder of the couplings for transistors Q1 through Q4. In FIG. 11, portions 1104 and 1106 couple the sources of transistors Q1 and Q2 together and the sources of transistors Q3 and Q4. Further, the sources of Q3 and Q4 are coupled together with metallization layer 504. Each of portions 1104 and 1106 includes a jumper using vias 1102 to couple metallization layer 504 to metallization layer 704 with the jumpers being an example of parallel lines formed in metallization layer 704 In FIG. 12, portions 1204 and 1206 couple the drains of transistors Q1 and Q3 together and the drains of transistors Q2 and Q4 together. Here, a jumper is formed for portion 1204 with vias 1202 coupling metallization layer 702 to metallization layer 704.

Figure 13:
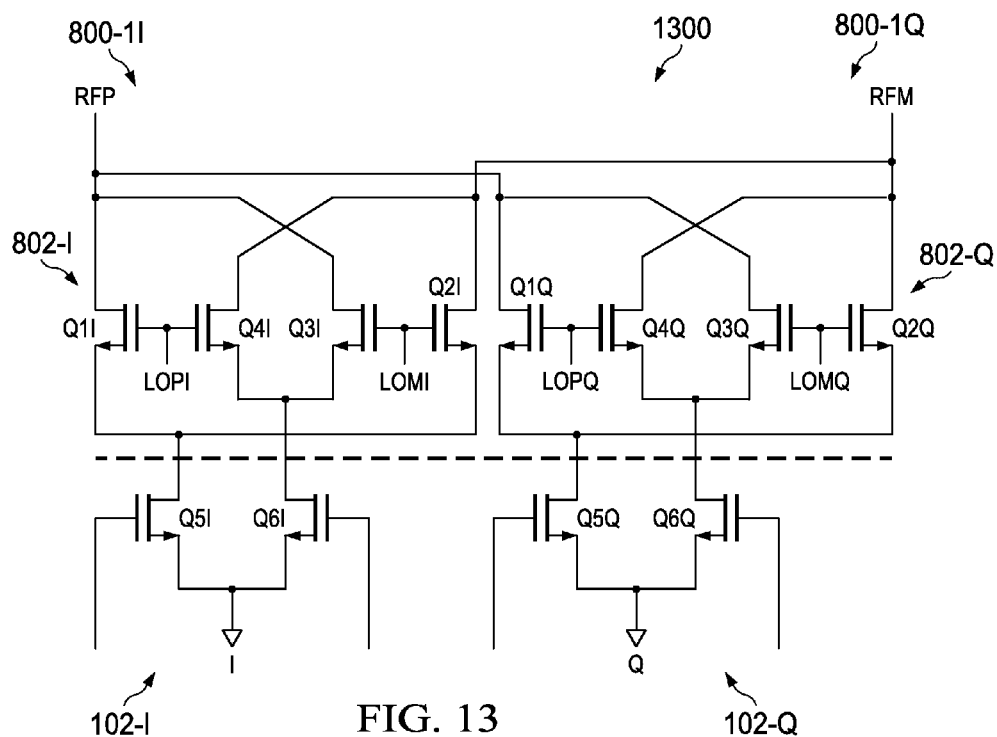
FIG. 13 is a circuit diagram of an IQ mixer that employs the mixer of FIG. 8.
Figure 2:
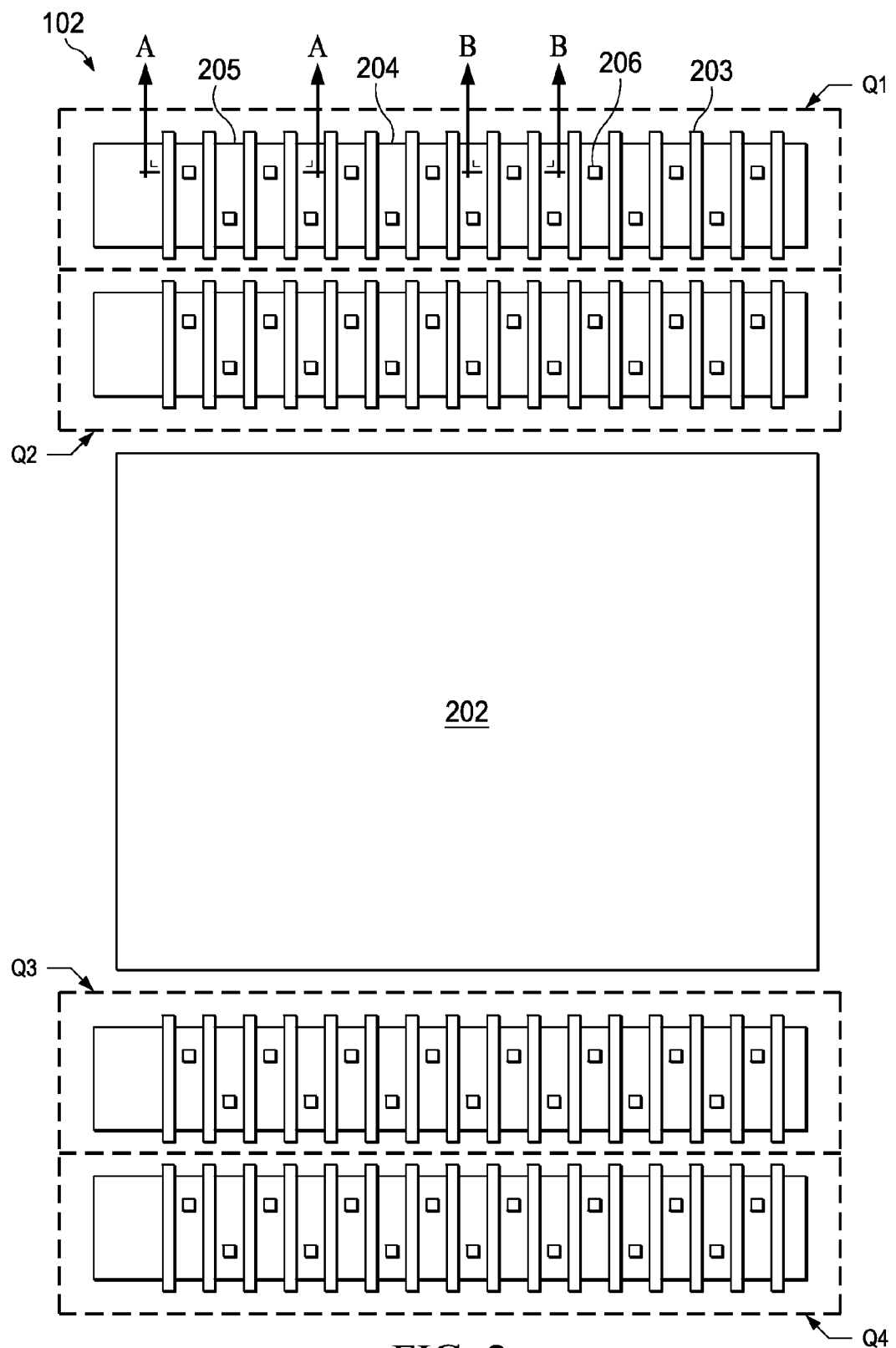
FIG. 2 is a plan view of the layout for the transistors of switching core of the mixer of FIG. 1.
Figure 3:
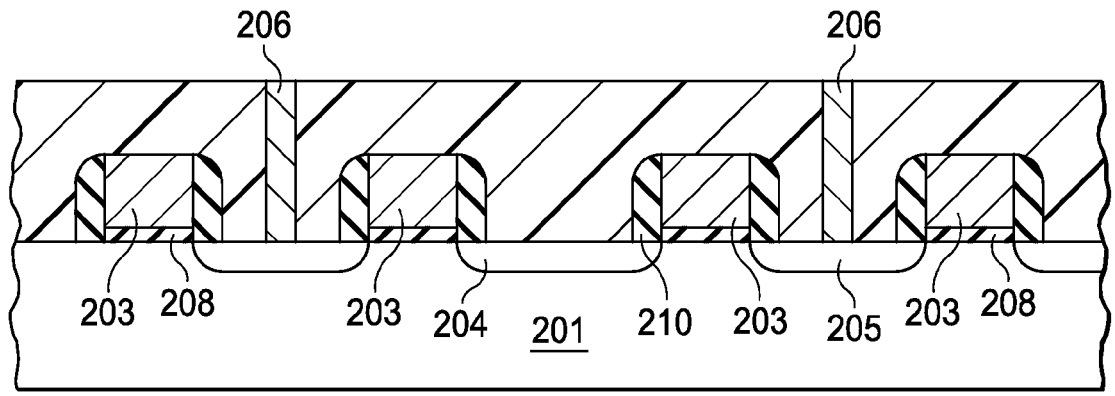
FIG. 3 is a cross-sectional of FIG. 2 along section line A-A.
Figure 4:
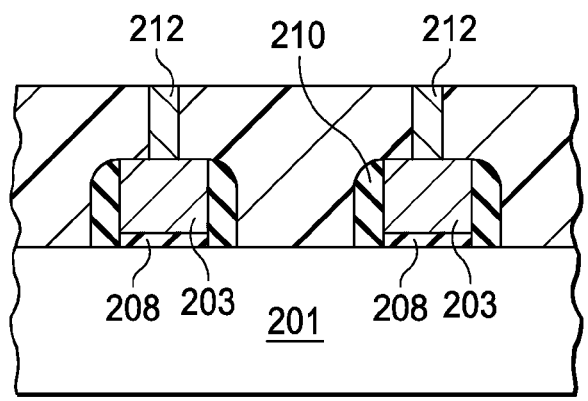
FIG. 4 is a cross-sectional view of FIG. 2 along section line B-B.
Figure 5:
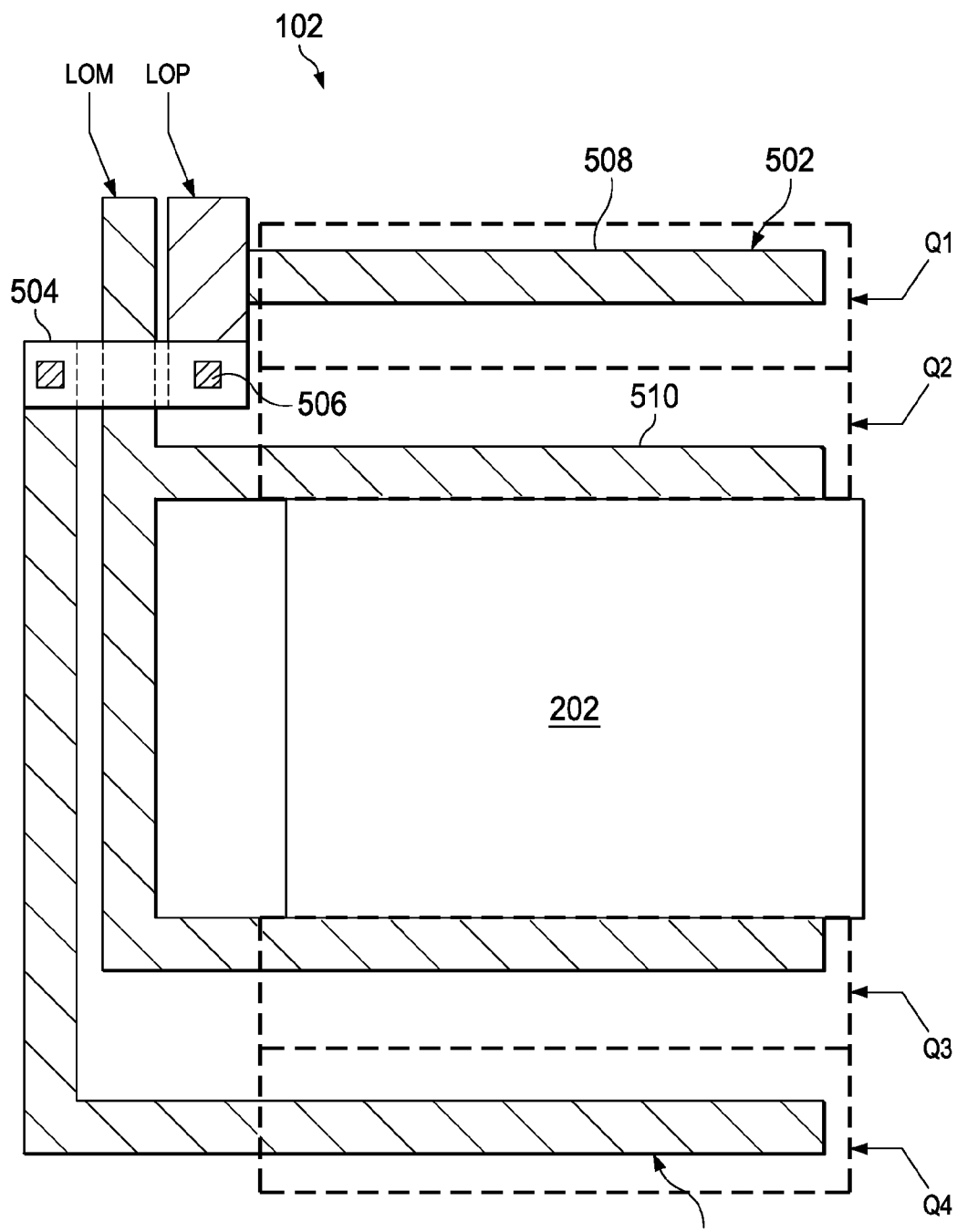
FIGS. 5 through 7 are plan views of the metallization layers form the coupling for the transistors of switching core of the mixer of FIG. 1.
Figure 6:
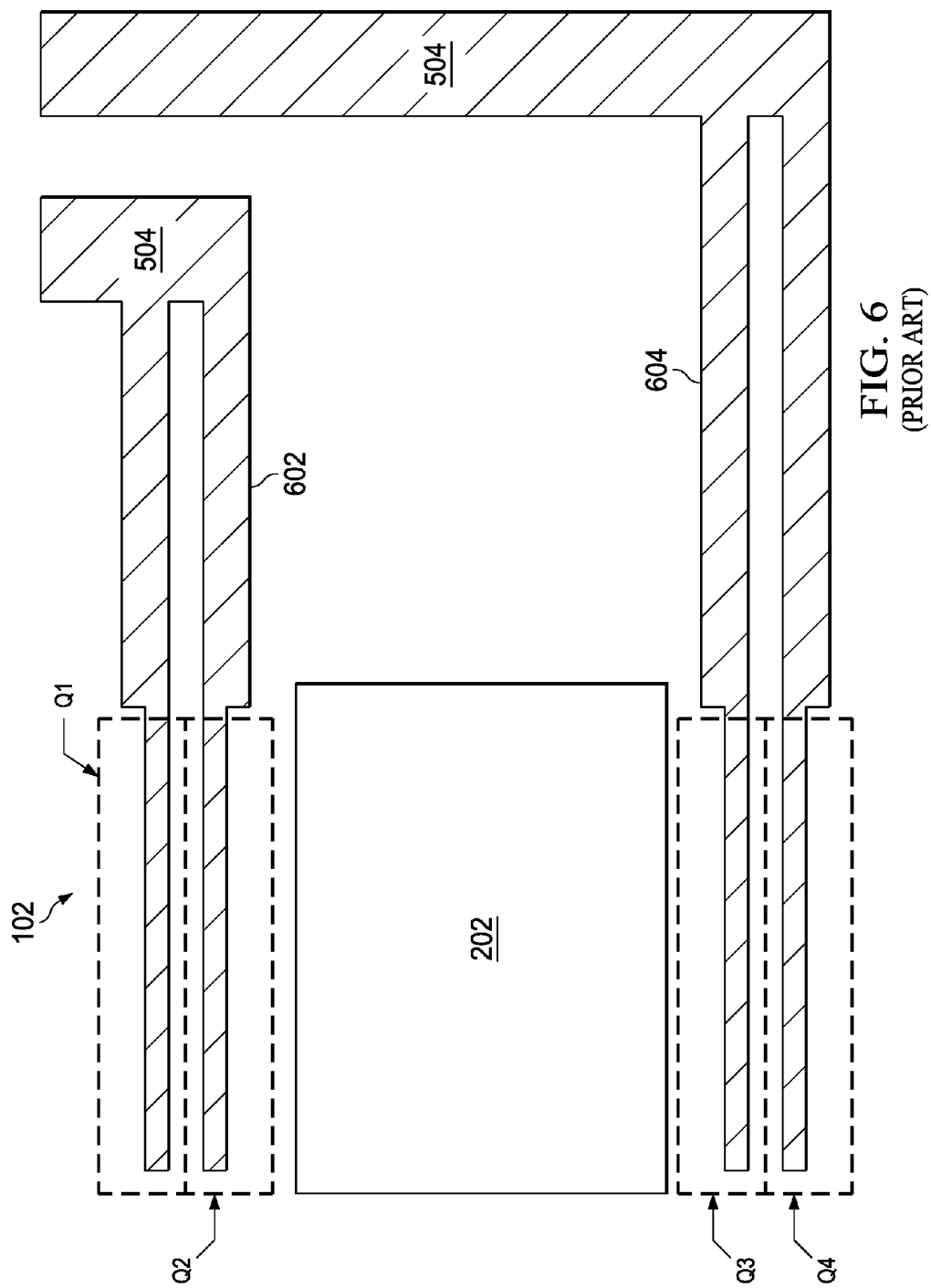
Figure 7:
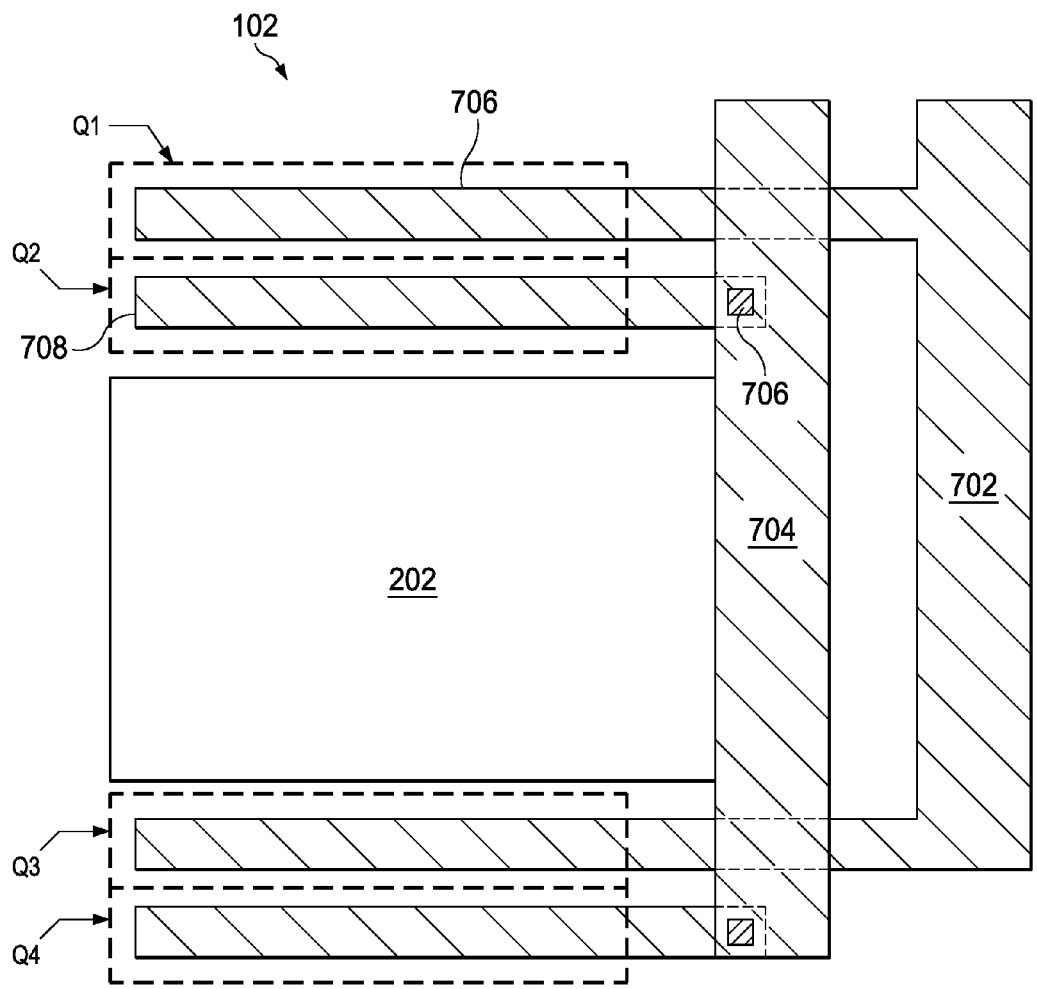

Turning to FIG. 13, an IQ or in-phase/quadrature mixer 1300 can be seen. This IQ mixer uses mixers 800-11 and 800-1Q (which, as shown in this example, each use mixer 800-1 for the in-phase and quadrature sides of IQ mixer 1300). As with mixer 800-1, each mixer 800-11 and 800-2Q generally comprises transconductance circuits 102-I and 102-Q (which generally comprises transistors Q5I, Q6I, Q5Q, and Q6Q) that receive input signals I and Q and switching cores 802-I and 802-Q (which generally comprise transistors Q1I to Q4I and Q1Q to Q4Q) that receives local oscillator signals LOPI/LOMI and LOPQ/LOMQ for the I and Q sides. As a result of using switching cores 802-I and 802-Q, IQ mixer 1300 can receive the same benefits due to a general lack of self-mixing or general lack of feed-through as mixer 800-1 or 800-2. Further IQ mixer 1300 benefits from improved sideband suppression and image rejection. Alternatively, IQ mixer 1300 may also use switching core 802-2.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a first transistor having a control electrode formed over a substrate, a first conduction region formed in the substrate, and a second conduction region formed in the substrate;
   a second transistor having a control electrode formed over the substrate, a first conduction region formed in the substrate, and a second conduction region formed in the substrate;
   a third transistor having a control electrode formed over the substrate, a first conduction region formed in the substrate, and a second conduction region formed in the substrate;
   a fourth transistor having a control electrode formed over the substrate, a first conduction region formed in the substrate, and a second conduction region formed in the substrate;
   a first portion of a first metallization layer formed over the substrate that carries a first portion of a differential local oscillator signal, wherein the first portion of the first metallization layer is coupled to the gates electrodes of the first and second transistors;
   a second portion of a first metallization layer formed over the substrate that carries a second portion of the differential local oscillator signal, wherein the first portion of the first metallization layer is coupled to the gates electrodes of the third and fourth transistors, wherein the first and second portions of the separated from one another;
   a first portion of a second metallization that is formed over the substrate, wherein the first portion of the second metallization layer is coupled to the first conduction regions of the first and fourth transistors; and
   a second portion of the second metallization layer that is formed over the substrate, wherein the second portion of the second metallization layer is coupled to the first conduction regions of the second and third transistors, and wherein one of the first and second portions of the second metallization layer includes a jumper so as to enable the first and second portions of the second metallization layer to cross, wherein each control electrode further comprises a gate electrode, and wherein each first conduction region further comprises a source region, and wherein each second conduction region further comprises a drain region, and wherein the jumper further comprises a first jumper, and wherein the apparatus further comprises:

a first portion of a third metallization layer formed over the substrate, wherein the first portion of the third metallization layer is coupled to the second conduction regions of first and third transistors; and a second portion of the third metallization layer formed over the substrate, wherein the second portion of the third metallization layer is coupled to the second conduction regions of the second and fourth transistors, and wherein at least one of the first and second portions of the third metallization layer includes a second jumper so as to enable the first and second portions of the third metallization layer to cross, wherein the first jumper further comprises first and second portions of a fourth metallization layer, wherein the first portion of the second metallization layer is coupled to the first portion of the fourth metallization layer, and wherein the second portion of the second metallization layer is coupled to the second portion of the fourth metallization layer, wherein the first jumper further comprises a portion of a fourth metallization layer that is formed over a section of the second portion of the second metallization that is coupled to the first portion of the second metallization layer.

2. The apparatus of claim 1, wherein the first and second portions of the fourth metallization layer further comprise first and second lines that are generally parallel to one another.

3. The apparatus of claim 1, wherein the second jumper further comprises first and second portions of a fourth metallization layer, wherein the first portion of the third metallization layer is coupled to the first portion of the fourth metallization layer, and wherein the second portion of the third metallization layer is coupled to the second portion of the fourth metallization layer.

4. The apparatus of claim 3, wherein the first and second portions of the fourth metallization layer further comprise first and second lines that are generally parallel to one another.

5. The apparatus of claim 1, wherein the second jumper further comprises a portion of a fourth metallization layer that is formed over a section of the second portion of the second metallization that is coupled to the first portion of the second metallization layer.

6. The apparatus of claim 1, wherein each of the first, second, third, and fourth transistors further comprises a plurality gate electrodes, a plurality of source regions, and a plurality of drain regions.

7. An apparatus comprising:
a transconductance circuit; and
a switching core including:
a first transistor having a gate electrode formed over a substrate, a source region formed in the substrate, and a drain region formed in the substrate;
a second transistor having a gate electrode formed over the substrate, a source region formed in the substrate, and a drain region formed in the substrate;
a third transistor having a gate electrode formed over the substrate, a source region formed in the substrate, and a drain region formed in the substrate;
a fourth transistor having a gate electrode formed over the substrate, a source region formed in the substrate, and a drain region formed in the substrate;
a first portion of a first metallization layer formed over the substrate that carries a first portion of a differential local oscillator signal, wherein the first portion of the first metallization layer is coupled to the gates electrodes of the first and second transistors;
a second portion of a first metallization layer formed over the substrate that carries a second portion of the differential local oscillator signal, wherein the first portion of the first metallization layer is coupled to the gates electrodes of the third and fourth transistors, wherein the first and second portions of the separated from one another;
a first portion of a second metallization that is formed over the substrate, wherein the first portion of the second metallization layer is coupled to the source regions of the first and fourth transistors, and wherein the first portion of the second metallization layer is coupled to the transconductance circuit;
a second portion of the second metallization layer that is formed over the substrate, wherein the second portion of the second metallization layer is coupled to the source regions of the second and third transistors, and wherein one of the first and second portions of the second metallization layer includes a jumper so as to enable the first and second portions of the second metallization layer to cross, and wherein the second portion of the second metallization layer is coupled to the transconductance circuit, wherein the jumper further comprises a first jumper, and wherein the apparatus further comprises:

a first portion of a third metallization layer formed over the substrate, wherein the first portion of the third metallization layer is coupled to the drain regions of first and third transistors; and a second portion of the third metallization layer formed over the substrate, wherein the second portion of the third metallization layer is coupled to the drain regions of the second and fourth transistors, and wherein at least one of the first and second portions of the third metallization layer includes a second jumper so as to enable the first and second portions of the third metallization layer to cross, wherein the first jumper further comprises first and second portions of a fourth metallization layer, wherein the first portion of the second metallization layer is coupled to the first portion of the fourth metallization layer, and wherein the second portion of the second metallization layer is coupled to the second portion of the fourth metallization layer, wherein the first jumper still further comprises a portion of a fourth metallization layer that is formed over a section of the second portion of the second metallization that is coupled to the first portion of the second metallization layer.

8. The apparatus of claim 7, wherein the first and second portions of the fourth metallization layer further comprise first and second lines that are generally parallel to one another.

9. The apparatus of claim 7, wherein the second jumper further comprises first and second portions of a fourth metallization layer, wherein the first portion of the third metallization layer is coupled to the first portion of the fourth metallization layer, and wherein the second portion of the third metallization layer is coupled to the second portion of the fourth metallization layer.

10. The apparatus of claim 9, wherein the first and second portions of the fourth metallization layer further comprise first and second lines that are generally parallel to one another.

11. The apparatus of claim 7, wherein the second jumper further comprises a portion of a fourth metallization layer that is formed over a section of the second portion of the second metallization that is coupled to the first portion of the second metallization layer.

12. The apparatus of claim 7, wherein each of the first, second, third, and fourth transistors further comprises a plurality gate electrodes, a plurality of source regions, and a plurality of drain regions.

13. The apparatus of claim 7, wherein the first, second, third, and fourth transistors further comprise first, second, third, and fourth NMOS transistors.

14. The apparatus of claim 13, wherein the transconductance circuit further comprises:
  a fifth NMOS transistor that is coupled to the first portion of the second metallization layer its drain; and
  a sixth NMOS transistor that is coupled to the second portion of the second metallization layer at its drain and that is coupled o the source of the fifth NMOS transistor at its source.

* * * * *